(12) United States Patent
Kamata

(10) Patent No.: US 6,618,561 B2
(45) Date of Patent: Sep. 9, 2003

(54) STOP CHANGING DEVICE FOR A CAMERA

(75) Inventor: Kazuo Kamata, Minami-Ashihgara (JP)

(73) Assignee: Fuji Photo Film, Co., Ltd., Kanagawa (JP)

( * ) Notice: Subject to any disclaimer, the term of this patent is extended or adjusted under 35 U.S.C. 154(b) by 0 days.

(21) Appl. No.: 10/155,969

(22) Filed: May 29, 2002

(65) Prior Publication Data

US 2002/0181950 A1 Dec. 5, 2002

(30) Foreign Application Priority Data

May 30, 2001 (JP) ........................................ 2001-162803

(51) Int. Cl.[7] .............................. G03B 9/02; G03B 7/085
(52) U.S. Cl. ..................... 396/170; 396/257; 396/505
(58) Field of Search ................................. 396/168, 170, 396/257, 259, 458, 460, 463, 505, 506, 508

(56) References Cited

U.S. PATENT DOCUMENTS 3,446,129 A * 5/1969 Burgarella .................. 396/168

FOREIGN PATENT DOCUMENTS

| JP | 1-130118 | 9/1989 |
| JP | 9-5817 | 1/1997 |

* cited by examiner

*Primary Examiner*—Russell Adams
*Assistant Examiner*—Arthur A Smith
(74) *Attorney, Agent, or Firm*—Young & Thompson

(57) ABSTRACT

A lens-fitted photo film unit is provided with a movable stop plate formed with small and middle stop apertures. The small stop aperture has a smaller diameter, and the middle stop aperture is larger than the small stop aperture. A fixed large stop aperture, which is larger than the middle stop aperture, is disposed behind the movable stop plate. The movable stop plate is moved to position the small stop aperture at a photographic optical axis when subject brightness is a predetermined reference value or more. Similarly, the middle stop aperture is positioned at the optical axis when the subject brightness is less than the reference value and a flash switch is turned off. Further, the fixed large stop aperture is set to the optical axis when the subject brightness is less than the reference value and the flash switch is turned on.

14 Claims, 8 Drawing Sheets

STOP CHANGING DEVICE FOR A CAMERA

BACKGROUND OF THE INVENTION

1. Field of the Invention

The present invention relates to a stop changing device for a camera, and particularly to a stop changing device favorable to a single-use camera of a lens-fitted photo film unit and so forth.

2. Description of the Related Art

As a sort of simplified cameras, lens-fitted photo film units of various types are put in the market by the present assignee. The lens-fitted photo film unit includes a simple photographing mechanism including a taking lens, a shutter mechanism, and so forth. Further, the lens-fitted photo film unit is loaded with an unexposed photographic film in advance. A user can easily take a picture having good image quality. As to the lens-fitted photo film unit, f-number and shutter speed of the taking lens are fixed for the purpose of lowering its price and reducing its size so that exposure conditions are constant. Thus, a range of a photographic condition for properly photographing a main subject and the background thereof is narrow. If subject brightness is outside the above-noted range, the photographic image quality deteriorates. Meanwhile, some of the lens-fitted photo film units have a built-in flash unit. In virtue of the flash unit, it is possible to take a picture in a state that the subject brightness is low, namely in a room, in the night-time, and so forth.

With the recent innovation of technology, it is required to improve the performance of the lens-fitted photo film unit. In view of this, it is considered to incorporate a mechanism, which changes the exposure conditions in accordance with various photographic circumstances, into the lens-fitted photo film unit. Japanese Utility Model Laid-Open Publication No. 1-130118 discloses a lens-fitted photo film unit provided with a stop changing member, which changes a stop by setting a movable stop plate to a photographic optical axis. The movable stop plate is formed with an aperture smaller than a fixed stop aperture. The stop changing member is associated with a flash switch operated for selecting whether or not a flash device emits a flash light. When the flash switch is turned on, the flash light is emitted and the fixed stop aperture is used to focus on a nearby subject. When the flash switch is turned off, emission of the flash light is prohibited. At the same time, the smaller stop aperture is used to make a depth of field deep. Owing to this, it is possible to properly take a picture not only of a nearby subject but also of a middle-distance subject.

In the meantime, Japanese Patent Laid-Open Publication No. 9-5817 discloses another stop changing device provided with a movable stop plate, a photometry unit, and an electromagnet. The movable stop plate is formed with an aperture, which is smaller than a fixed stop aperture. The photometry unit measures subject brightness, and outputs a setting signal when a light amount is a predetermined value or more. The electromagnet is activated when the setting signal is outputted. In this stop changing device, the movable stop plate is associated with a winding operation of a photographic film to approach the electromagnet. When the electromagnet is activated, magnetic suction is caused between the movable stop plate and the electromagnet to hold the movable stop plate against a spring. When the electromagnet is not activated, the magnetic suction is not caused between the movable stop plate and the electromagnet so that the movable stop plate is drawn by the spring.

Regarding the lens-fitted photo film unit in which setting of the stop is performed in two steps so as to be associated with the foregoing flash switch, an overexposure is caused when flash photographing is performed under conditions of the sunshine daylight and the larger stop aperture. Hence, product quality deteriorates. Moreover, printing time is prolonged in a laboratory so that printing cost increases. Further, since the depth of field becomes shallow, the background of the main subject is out of focus. The blur of the background is conspicuous in the daytime photographing, because the background is photographed brightly. Meanwhile, when a picture is taken at an obscurity place, for example at the evening outdoors, many of photographers judge that the flash light is unnecessary. Thereupon, photographing is performed in a state that the flash switch is turned off. Accordingly, the smaller stop aperture is used for photographing so that it is likely to cause an underexposure.

As to the lens-fitted photo film unit in which the stop is set to either of two states in accordance with a result of photometry, a diameter of the smaller stop aperture is determined such that the overexposure is not caused at a high-intensity value (+5.0 EV) of film latitude when photographing is performed at an upper limit of general brightness. It is desirable to change the stop on the basis of a proper exposure amount of the smaller stop aperture. In a case the photographic film is a negative photosensitive material, the optimum exposure amount is +1.0 EV. On account of this, the stop is changed when the subject brightness is substantially EV12.0. Photographers, however, are likely to judge that it is still bright when the subject brightness is within a range of EV12.0 to EV10.0. For this reason, photographing is performed without emitting the flash light so that the underexposure is caused.

SUMMARY OF THE INVENTION

In view of the foregoing, it is a primary object of the present invention to provide a stop changing device for a camera in which exposure is automatically and simply controlled in accordance with subject brightness and flash photographing.

It is a second object of the present invention to provide a stop changing device for a camera in which an exposure amount is adjusted to prevent an underexposure from occurring in a dark place.

In order to achieve the above and other objects, the stop changing device for the camera comprises a single stop plate, which is movable relative to a photographic optical axis. The stop plate is formed with a first stop aperture and a second stop aperture. The first stop aperture is smaller than a fixed stop aperture, and the second stop aperture is smaller than the first stop aperture. When subject brightness measured by a photometry unit is a predetermined level or more, the stop plate is moved so as to position the second stop aperture at the optical axis regardless of an operation of a flash switch. When the subject brightness is less than the predetermined level, the stop plate is moved so as to position either of the fixed stop aperture and the first stop aperture at the optical axis in accordance with the operation of the flash switch. Concretely, the fixed stop aperture is used at the time of flash photographing, and the first stop aperture is used at the time of non-flash photographing.

In a preferred embodiment, the stop plate is rotatable and the stop changing device includes an electromagnet and a stopper besides the rotatable stop plate. The electromagnet is activated to hold the stop plate against a spring. Thereby, the second stop aperture is positioned at the optical axis. The stopper enters a movement area of the stop plate in accordance with the operation of the flash switch. When the non-flash photographing is performed, the stopper enters the movement area of the stop plate to abut on the stop plate. Owing to this, the first stop aperture is positioned at the optical axis. When the flash photographing is performed, the stopper is evacuated so that the stop plate is allowed to move to the outside of the optical axis.

In another embodiment, the stop plate is slidable and further has a large opening formed between the first and second stop apertures. The large opening is used for setting the fixed stop aperture. In this embodiment, the stop changing device includes an electromagnet, a first stopper, and a second stopper. When the subject brightness is the predetermined level or more, the electromagnet holds the stop plate against a spring so as to position the second stop aperture at the optical axis. The first stopper enters the movement area of the stop plate in association with the operation of the flash switch. When the flash photographing is performed, the first stopper enters the movement area of the stop plate to abut thereon. Owing to this, the large opening is positioned at the optical axis. When the non-flash photographing is performed, the first stopper is evacuated to allow the further movement of the stop plate. The second stopper abuts on the stop plate, which has slid across the first stopper, to position the first stop aperture at the optical axis.

According to the present invention, a structure of the stop changing device may be simplified and the manufacture cost thereof may be reduced. Further, it is possible to adjust an exposure amount without enlarging a size of the stop changing device so that a picture may be taken at a dark place without causing underexposing.

BRIEF DESCRIPTION OF THE DRAWINGS

The above objects and advantages of the present invention will become apparent from the following detailed description of the preferred embodiments of the invention when read in conjunction with the accompanying drawings, in which.

DETAILED DESCRIPTION OF THE PREFERRED EMBODIMENT (S)

Figure 1:
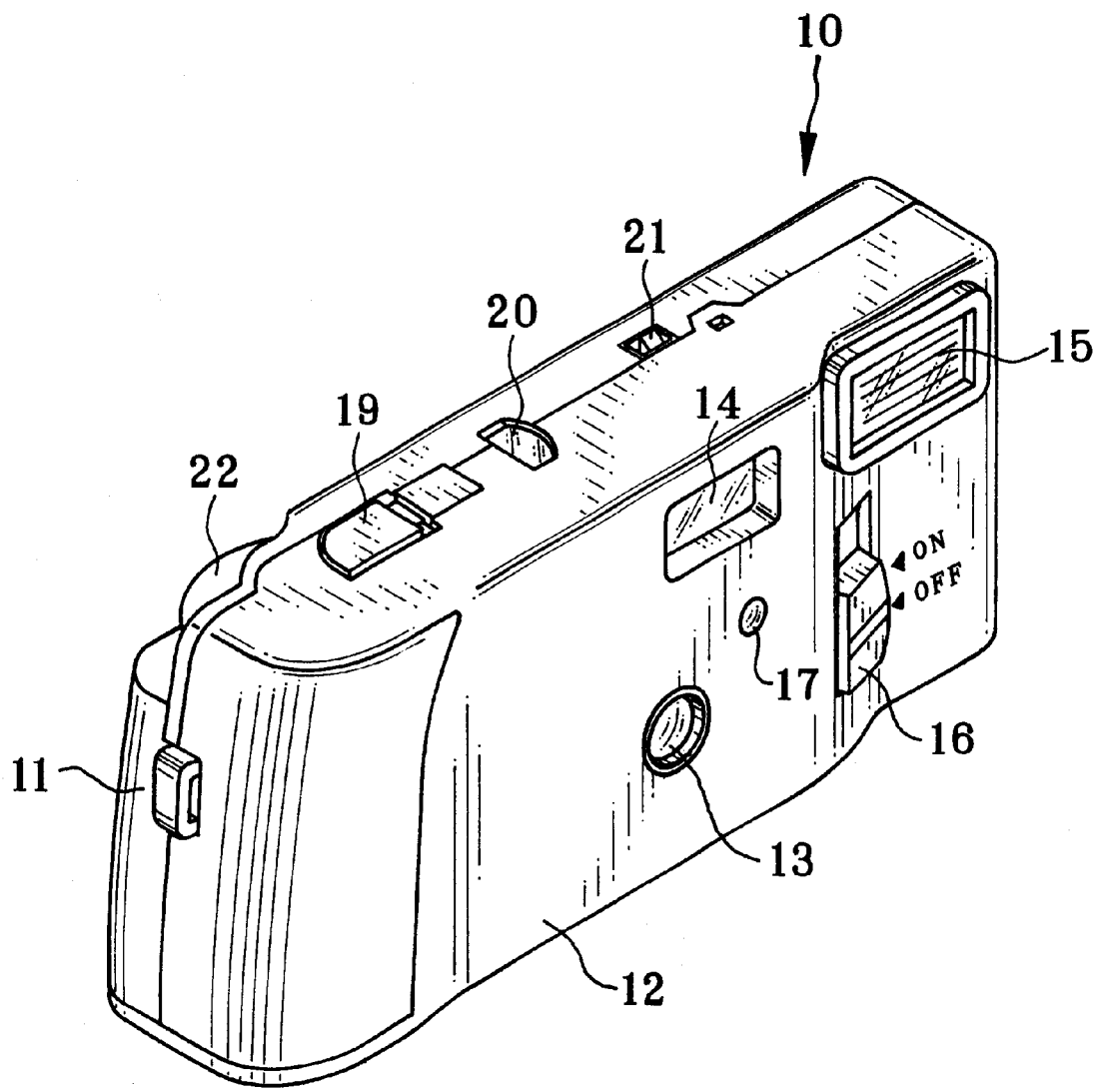
FIG. 1 is a perspective view showing a lens-fitted photo film unit according to the present invention.

As shown in FIG. 1, a lens-fitted photo film unit (hereinafter, film unit) 10 is constituted of a unit body 11 and an outer label 12 for covering a surface of the unit body 11. The front of the unit body 11 is provided with a taking lens 13, a viewfinder lens 14, a flash portion 15, a flash switch 16, and a light receiving element 17 for measuring subject brightness. The top of the unit body 11 is provided with a release button 19, a film counter 20, and a confirmation window for confirming flash charging. Incidentally, a part of a take-up wheel 22 emerges through the back of the unit body 11.

Figure 2:
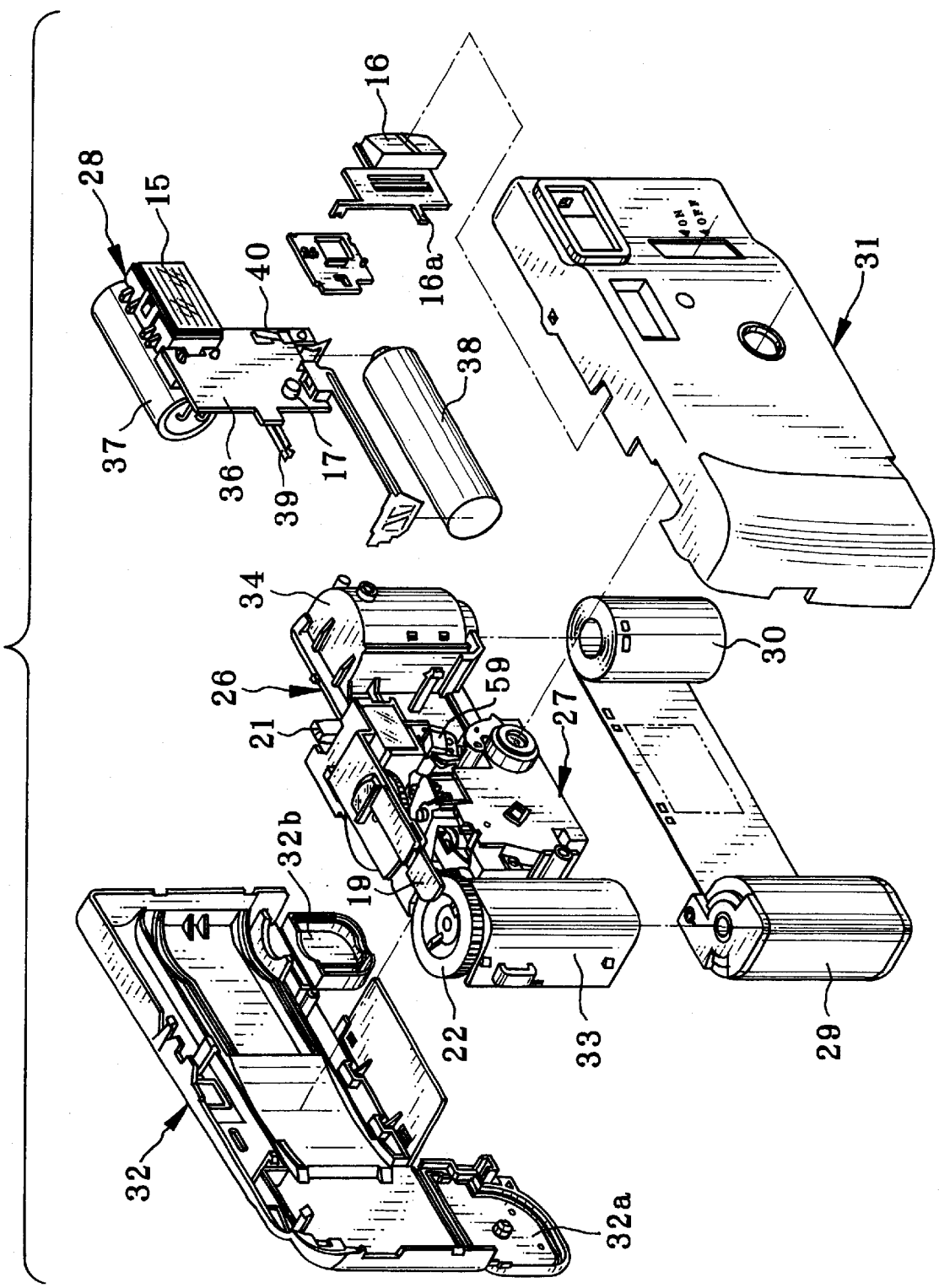
FIG. 2 is an exploded perspective view showing the lens-fitted photo film unit.

As shown in FIG. 2, the unit body 11 is constituted of a main body 26, an exposure unit 27, a flash unit 28, a cartridge shell 29, a photographic film 30, a front cover 31, and a rear cover 32. The main body 26 is constituted of an exposure frame (not shown) for defining an exposure area of the photographic film 30, a cartridge chamber 33 for containing the cartridge shell 29, and a film chamber 34 for containing the photographic film 30 drawn out of the cartridge chamber 33 and wound in roll form. The photographic film 30 is advanced by rotating the take-up wheel 22 attached to the top of the cartridge chamber 33.

The front cove 31 is disposed in front of the main body 26 and is formed with openings for exposing the taking lens 13, the viewfinder lens 14, and so forth. The rear cover 32 is disposed behind the main body 26 to light-tightly cover the inside of the unit body 11 together with the front cover 31. The rear cover 32 is integrally formed with bottom lids 32a and 32b for light-tightly covering the bottoms of the cartridge shell 29 and the photographic film 30.

The flash unit 28 is disposed at a lateral side of the exposure unit 27, and is constituted of a printed circuit board 36, the flash portion 15 attached to the printed circuit board 36, a capacitor 37, a battery 38, and a synchro switch 39. The capacitor 37 is charged by a flash circuit to emit the flash light from the flash portion 15.

The flash switch 16 is slidable in a vertical direction to change ON-OFF states of a charge switch 40. Upon pushing the flash switch 16 up, the charge switch 40 provided on the printed circuit board 36 is turned on to charge the capacitor 37. When charging the capacitor 37 is completed, an LED (not shown) provided on the printed circuit board 36 is blinked. Blinking of the LED is adapted to be confirmed through the confirmation window 21. Upon a shutter-releasing operation, the synchro switch 39 is turned on to emit the flash light from the flash portion 15. Meanwhile, the side of the flash switch 16 is integrally formed with a projection 16a protruding toward the exposure unit 27.

Figure 3:
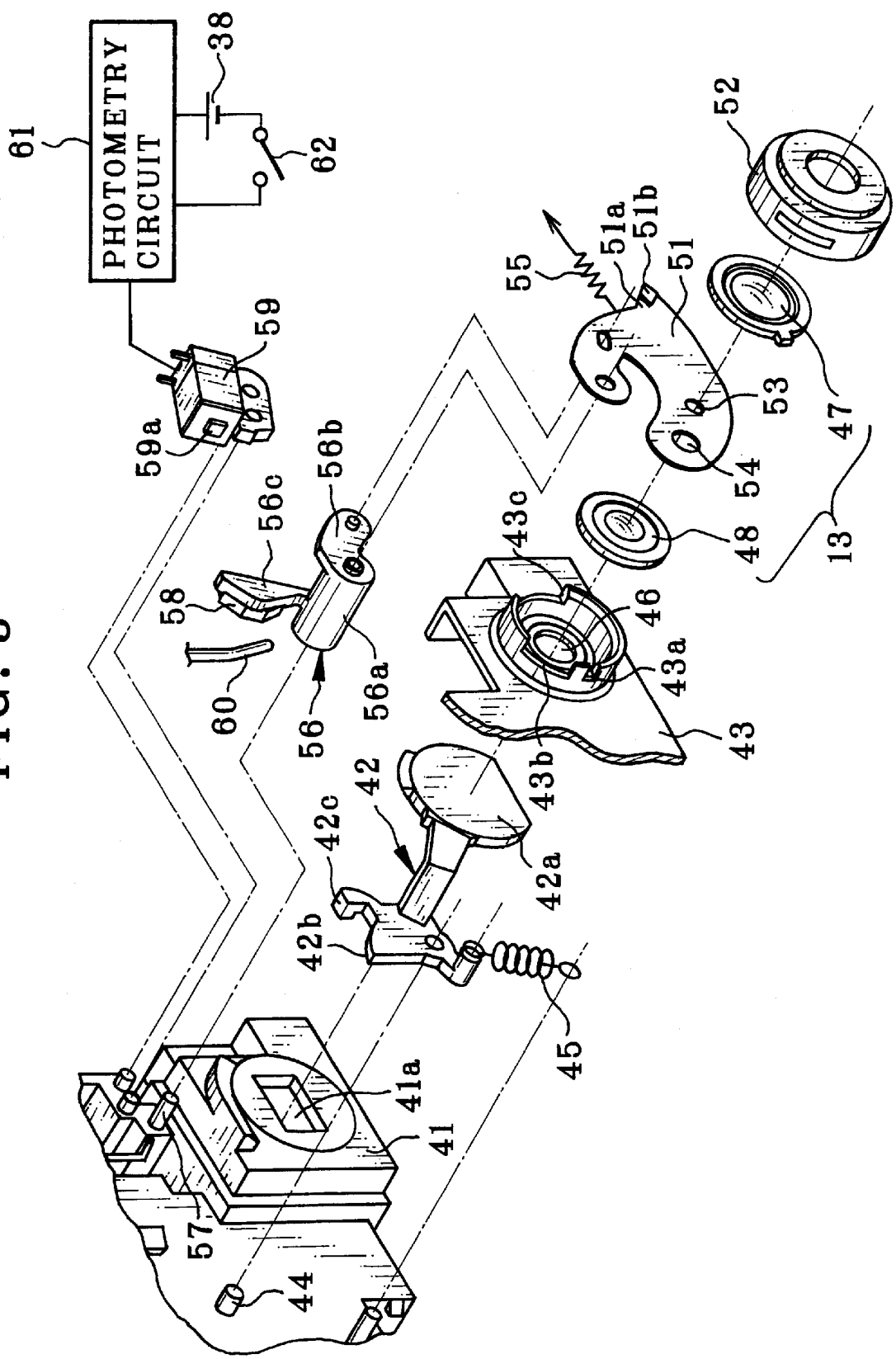
FIG. 3 is an exploded perspective view partially showing the lens-fitted photo film unit.

The exposure unit 27 is formed around the center of the main body 26 such as to unify a shutter mechanism, a film stopping mechanism, a counter mechanism for indicating a residual number of photographable frames, a viewfinder, and so forth. The exposure unit 27 is attached to a dark box 41. As shown in FIG. 3, the front of the dark box 41 is provided with an exposure opening 41a formed at a central portion thereof. Moreover, to the front of the dark box 41, are attached a shutter blade 42 and a lens holder 43 in order.

The shutter blade 42 includes a single sector blade and is rotatably attached to a pin 44 formed on the dark box 41. The shutter blade 42 is urged by a spring 45 so as to be kept in a closed position where a blade section 42a covers the exposure aperture 41a. When taking a picture, an edge of an attachment 42b is kicked by a shutter lever (not shown) interlocking with the release button 19 to be pressed. Upon this, the shutter blade 42 is rotated to an open position where the exposure aperture 41a is opened. In other words, the shutter blade 42 is rotated in a clockwise direction in the drawing. After that, the shutter blade 42 is returned to the closed position by the spring 45. During the rotation of the shutter blade 42, the exposure aperture 41a is opened to perform an exposure. Meanwhile, the shutter blade 42 is formed with a press member 42c. When the shutter blade 42 is set to the open position for opening the whole of the exposure aperture 41a, the press member 42c turns on the synchro switch 39.

The taking lens 13 is held inside a lens barrel 43a of the lens holder 43, and a fixed large stop aperture 46 is formed at the back thereof. The taking lens 13 is constituted of a first lens 47 and a second lens 48 between which a movable stop plate 51 is disposed. A lens cover 52 is attached to the front of the lens barrel 43a to hold a periphery of the first lens 47. The taking lens 13 is interposed between the lens holder 43 and the lens cover 52. Incidentally, the lens barrel 43a is formed with cut portions 43b and 43c via which a part of the movable stop plate 51 is kept in the lens barrel 43a.

The movable stop plate 51 is formed in an L-like shape, and a top portion thereof is formed with a small stop aperture 53 and a middle stop aperture 54. The small stop aperture 53 has a smaller diameter in comparison with the fixed large stop aperture 46. The middle stop aperture 54 is larger than the small stop aperture 53 and is smaller than the fixed large stop aperture 46. As to the film unit 10 according to the present invention, film sensitivity of the photographic film 30 is based on ISO 1600 and a shutter speed is $\frac{1}{125}$. Further, when the respective apertures are used as the stop, f-number is F5.6 in the case of merely using the fixed large stop aperture 46, and is F10.0 in the case of using the middle stop aperture 54, and is F18.0 in the case of using the small stop aperture 53. The diameters of the respective apertures may be properly changed in accordance with sorts of the film unit, the photographic film, and so forth. In the present embodiment, EV values of the respective stops have a difference of 1.7 EV in consideration of a finished-print difference due to a stop-changing point.

The movable stop plate 51 is urged by a spring 55 in a counterclockwise direction in the drawing. A rotational center of the movable stop plate 51 is a shaft of a stop lever 56. A right side of the movable stop plate 51 is integrally formed with a protrusion 51a. Incidentally, the movable stop plate 51 is extremely thin so that a plastic piece 51b is fixed to the protrusion 51a in order to prevent the movable stop plate 51 from transforming when engaging the protrusion 51a with the projection 16a. By the way, the projection 16a is inserted into a movement area of the movable stop plate 51 upon pushing the flash switch 16 down, and is evacuated from the movement area thereof upon pushing the flash switch 16 up.

The stop lever 56 is constituted of a shaft member 56a, an attachment section 56b, and a pressed section 56c. The stop lever 56 is rotatably attached to a pin 57 formed on the main body 26. The movable stop plate 51 is fixed to the attachment section 56b. An iron piece 58 is attached to the pressed section 56c. A solenoid 59 is constituted of an iron core 59a and a coil (not shown) wound around the iron core 59a to generate a magnetic force by electrifying the coil. The iron core 59a works as an electromagnet. The iron piece 58 is attached to one end of the stop lever 56 so that magnetic suction is caused between the solenoid 59 and the iron piece 58 upon electrifying the solenoid 59.

A press lever 60 is disposed near the pressed section 56c. In association with the rotation of the take-up wheel 22, the press lever 60 is moved toward the solenoid 59, pushing the pressed section 56c toward the solenoid 59. When the take-up wheel 22 is rotated by an amount corresponding to one frame of the photographic film, the press lever 60 makes the iron piece 58 contact with the solenoid 59. Incidentally, by depressing the release button 19, all of the movable stop plate 51, the stop lever 56, and the press lever 60 become rotatable.

The shutter mechanism is provided with a mechanical delay unit, which is not shown. The delay unit is actuated by depressing the release button 19 to keep the shutter lever in a charge position during a period (5 ms to 10 ms) required for moving the stop plate 51. Thus, it is prevented to perform the exposure during the movement of the stop plate 51. A photometry switch 62 is provided inside the delay unit. When the delay unit is actuated by depressing the release button 19, the photometry switch 62 is simultaneously turned on. A photometry circuit 61 and the photometry switch 62 constitute a photometry device using the battery 38 as a power source. The stop is changed by the photometry device, the movable stop plate 51, the solenoid 59, the spring 55, and the projection 16a.

The light receiving element 17, which is a part of the photometry circuit 61, is mounted on the printed circuit board 36. Upon rotating the take-up wheel 22 and operating the release button 19, the photometry circuit 61 measures the subject brightness with the light receiving element 17. When it is detected that the subject brightness is a predetermined reference value or more, the solenoid 59 is electrified. In the present embodiment, the reference value of the brightness is set to EV 12.0.

When the coil is electrified, the magnetic suction is caused between the solenoid 59 and the iron piece 58 so that the iron piece 58 is drawn to the solenoid 59 against the spring 55. Owing to this, the movable stop plate 51 is kept in an insert position where the small stop aperture 53 is positioned at the photographic optical axis. In contrast, when the coil is not electrified, the movable stop plate 51 is rotated by the spring 55 in the counterclockwise direction in the drawing. At this time, if the flash switch 16 is turned off, the movable stop plate 51 is kept in an intermediate insert position where the middle stop aperture 54 is positioned at the photographic optical axis. If the flash switch 16 is turned on, the movable stop plate 51 is kept in an evacuation position where the stop plate 51 is evacuated from the photographic optical axis.

Figure 4:
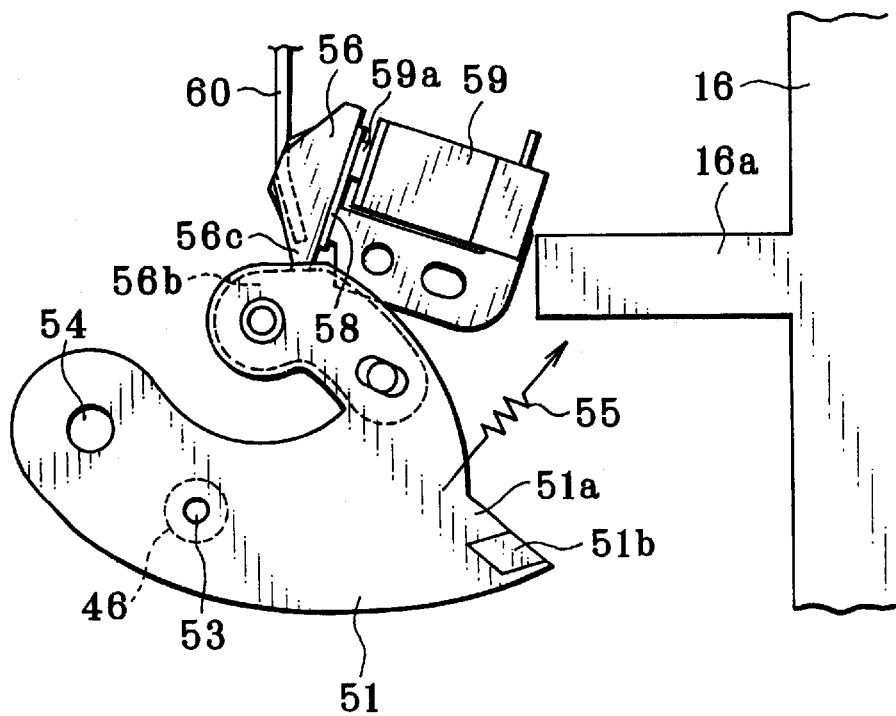
FIG. 4 is an explanatory illustration partially showing a stop changing device according to the present invention.

Next, an operation of the above structure is described below. A photographer rotates the take-up wheel 22 to wind up the photographic film 30. In association with the rotation of the take-up wheel 22, the press lever 60 moves to push the pressed section 56c toward the solenoid 59 against the spring 55. The take-up wheel 22 is successively rotated to wind up the photographic film 30 by an amount corresponding to one frame. Upon this, the shutter lever is moved to the charge position, and at the same time, the take-up wheel 22 is locked by the film stopping mechanism. The press lever 60 rotates the stop lever 56 to the position where the iron piece 58 abuts on the solenoid 59, such as shown in FIG. 4.

The photographer operates the flash switch 16 in a vertical direction to select whether or not the flash light is emitted from the flash portion 15. In the case that the flash light is not emitted, the flash switch 16 is set to a lower side, which is the OFF position. At this time, the projection 16a is inserted into the movement area of the movable stop plate 51. By contrast, in the case that the flash light is emitted, the flash switch 16 is set to an upper side, which is the ON position. At this time, the projection 16a is evacuated from the movement area of the movable stop plate 51.

The photographer performs framing of a subject, and depresses the release button 19 to actuate the delay unit. Simultaneously, the photometry switch 62 is turned on to activate the photometry circuit 61. When the subject brightness is the predetermined reference value or more, the solenoid 59 is electrified so that the iron piece 58 is magnetically drawn by the solenoid 59 to keep the movable stop plate 51 in the insert position. Thus, the small stop aperture 53 is positioned at the photographic optical axis. At this time, the movable stop plate 51 is kept in the insert position without regard to the setting position of the flash switch 16.

Figure 5:
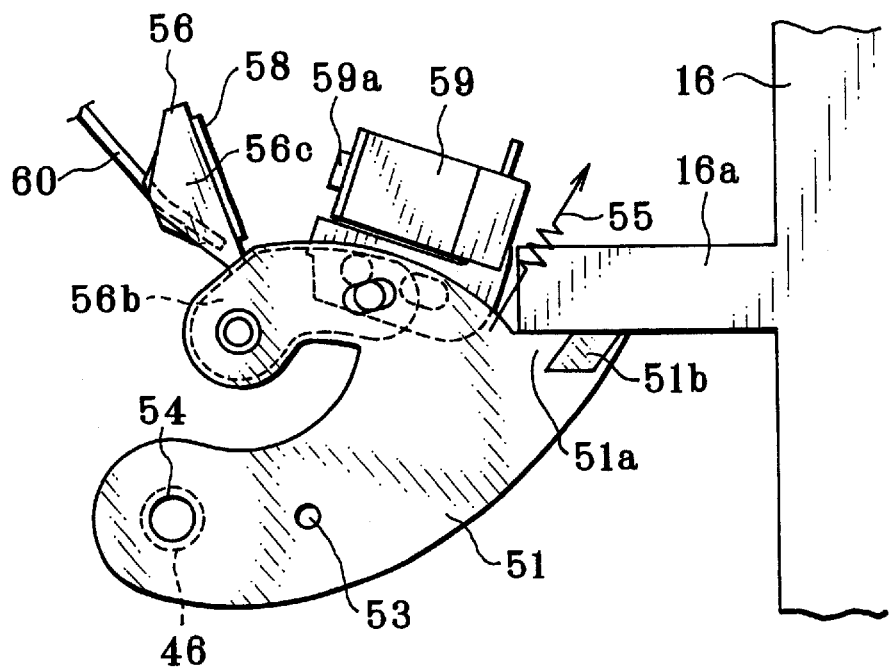
FIG. 5 is an explanatory illustration partially showing the stop changing device.

When the subject brightness is less than the reference value, the solenoid 59 is not electrified so that the stop lever 56 and the movable stop plate 51 are rotated by the spring 55 in the counterclockwise direction. In the case that the flash switch 16 is set to the OFF position, the protrusion 51a abuts on the projection 16a such as shown in FIG. 5. Thus, the movable stop plate 51 is disposed at the intermediate insert position to set the middle stop aperture 54 to the photographic optical axis. Meanwhile, in the case that the flash switch 16 is set to the ON position, the movable stop plate 51 is disposed at the evacuation position to merely set the fixed large stop aperture 46.

After the predetermined period (15 ms to 20 ms), the shutter lever retained by the delay unit is released to move from the charge position to the release position. During this movement, the shutter blade 42 is kicked to open the exposure aperture 41a so that the photographic film 30 is exposed. Successively, the exposure aperture 41a is shielded, and electrifying the solenoid 59 is stopped. The movable stop plate 51 is disposed at either of the intermediate insert position and the evacuation position.

Figure 7:
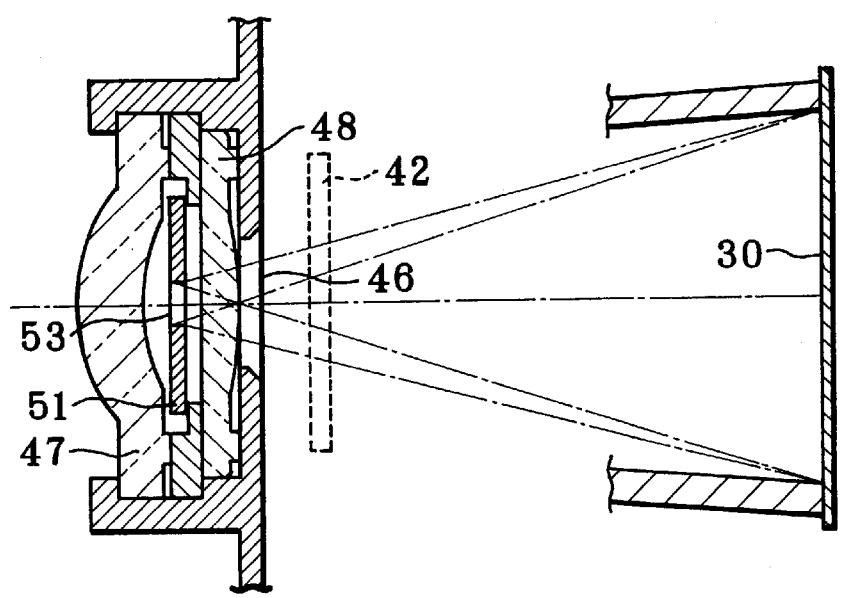
FIG. 7 is a partial section view of the lens-fitted photo film unit.

When the subject brightness is the reference value or more, namely when the subject is extremely bright such as outdoor photographing in nice weather, the exposure is performed through the small stop aperture 53 as shown in FIG. 4, regardless of the flash light. Incidentally, the small stop aperture is used in daylight synchronized-flash photography as well. An exposure amount is reduced to a proper value by the small stop aperture 53 such as shown in FIG. 7 so that it is possible to take a picture without causing the overexposure. In the present embodiment, a subject-brightness range of EV9.5 to EV16.5 is covered on account of transmittance of the taking lens. In virtue of this, it is possible to perform proper photographing even if a picture is taken in a bright place.

Figure 10:
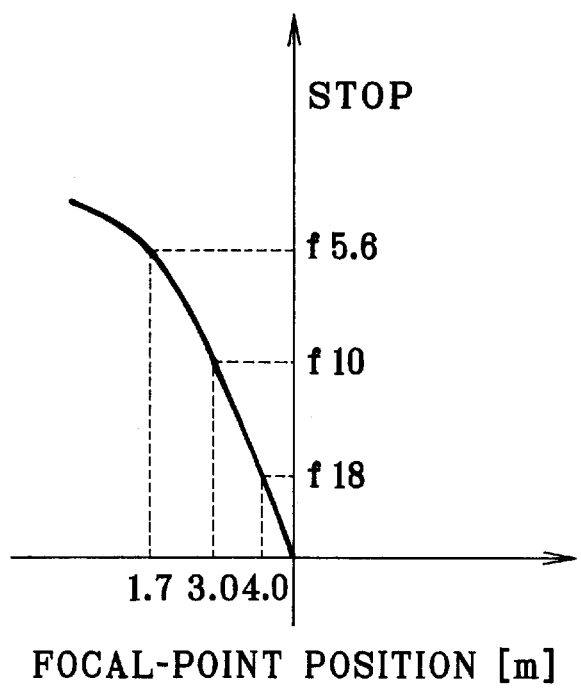
FIG. 10 is a graph showing a relationship between a stop and a focal-point position, which is caused by spherical aberration.
Figure 11:
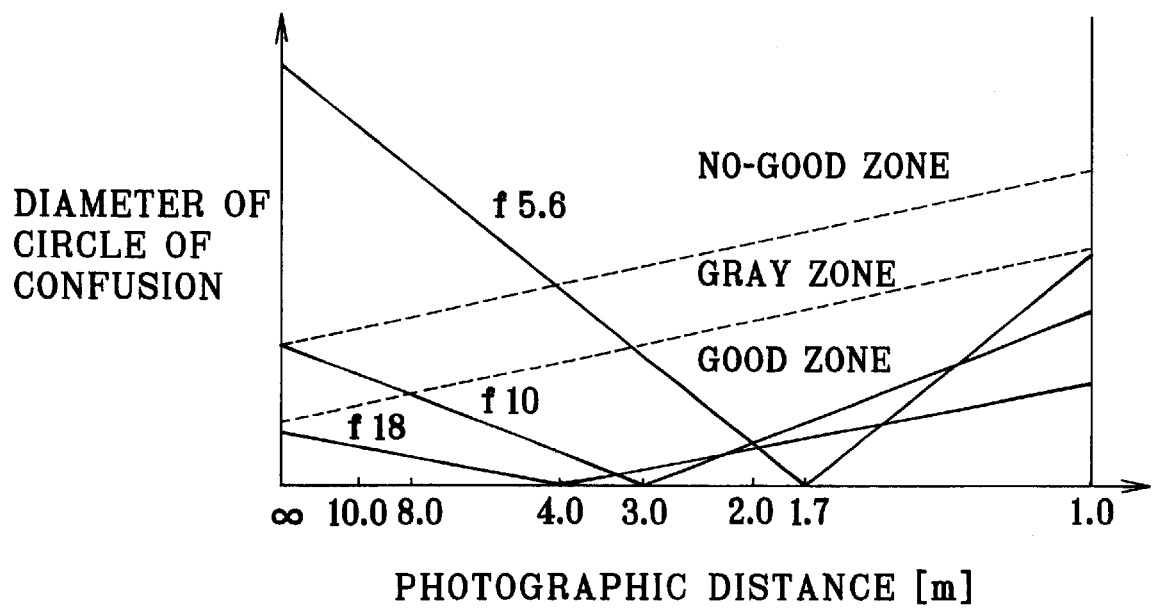
FIG. 11 is a graph showing a depth of field relative to a photographic distance in accordance with f-number of a lens.

FIG. 10 is a graph showing a relationship between the stop and a focal-point position, which is caused by spherical aberration. FIG. 11 is a graph showing a relationship between a photographic distance and a diameter of a circle of confusion, which is caused by difference of the f-numbers of the taking lenses. In FIG. 11, a vertical line represents the diameter of the circle of confusion, and a horizontal line represents the photographic distance. The taking lenses of the respective f-numbers are used, and an unsharp region is divided into three of a good zone, a gray zone, and a no-good zone. In this embodiment, the gray zone means a certain state in that acceptable image quality is obtained. In other words, the gray zone may satisfy a user having leniency relative to the image quality. As shown in FIG. 10, in accordance with the diameter change of the stop aperture, the focal-point position is changed due to the spherical aberration. In the case of f18.0, namely in the case of the exposure performed through the small stop aperture 53, the focal-point position moves to 4.0 m. Moreover, as shown in FIG. 11, the depth of field is also changed due to the diameter of the stop aperture. Thus, under the condition of f18.0, good image quality is obtained in the whole photographic area having an subject distance of 1.0 m or more.

Figure 8:
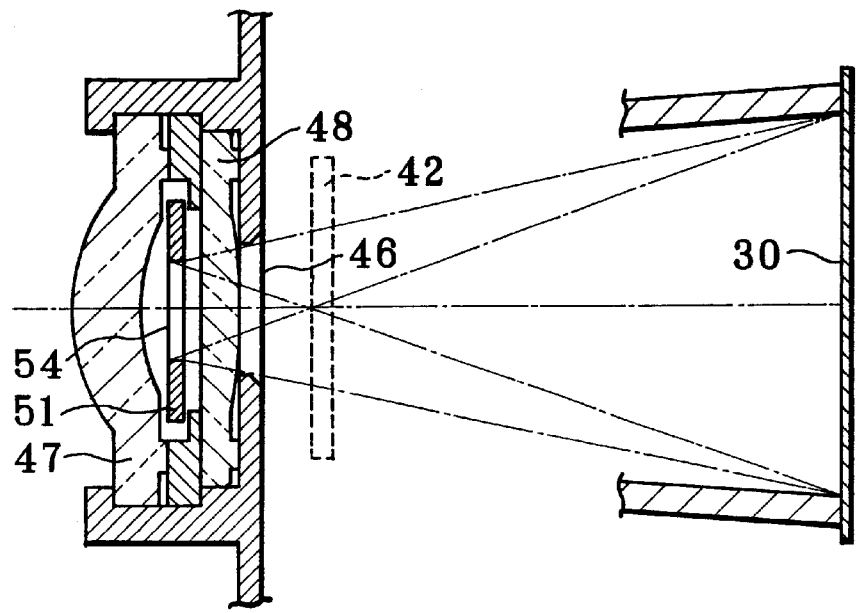
FIG. 8 is a partial section view of the lens-fitted photo film unit.

When the flash switch 16 is set to the OFF position and the subject brightness is less than the reference value, namely when it is judged that the flash light is unnecessary in spite of the insufficient subject brightness such as photographing in evening outdoor, the exposure is performed through the middle stop aperture 54 as shown in FIG. 5. The exposure amount increases owing to the middle stop aperture such as shown in FIG. 8. Accordingly, proper exposure is performed without causing the underexposure. In the present embodiment, the subject-brightness range of EV7.85 to EV14.85 is covered on account of the transmittance of the taking lens so that a picture may be properly taken at a place being dark to some extent.

In the case of f10.0, namely in the case of the exposure performed through the middle stop aperture 54, the focal-point position moves to 3.0 m and good image quality is obtained within an area having the subject distance of 1.0 m to 8.0 m, such as shown in FIGS. 10 and 11. Beyond this area, the gray zone exists up to an infinity. However, almost all of the photographic areas are covered.

Figure 6:
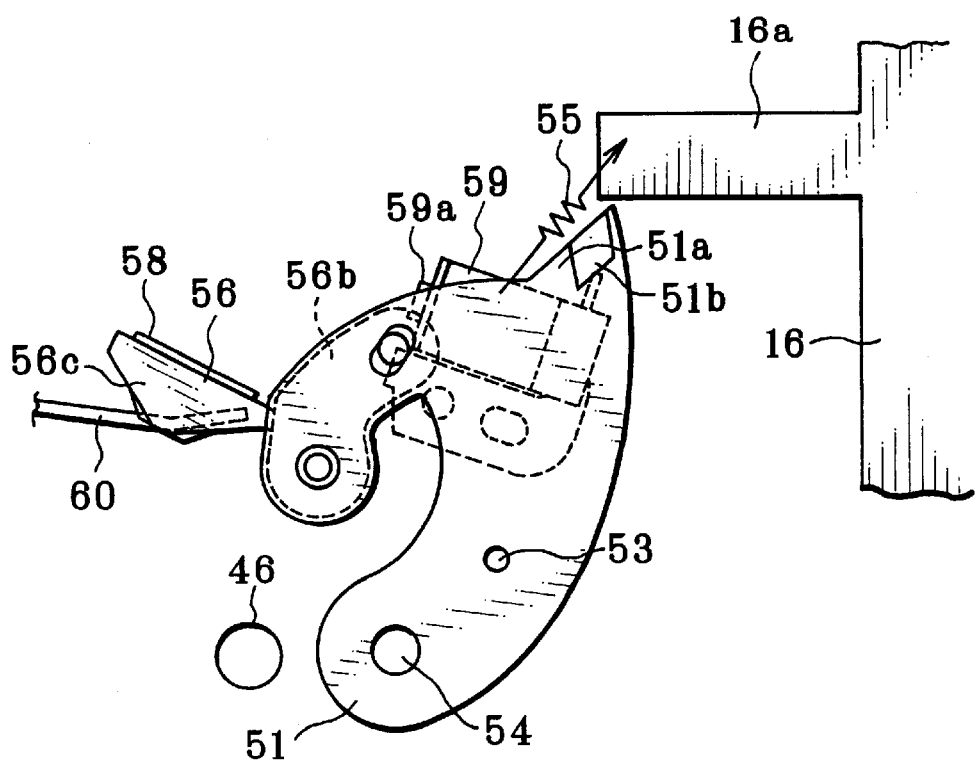
FIG. 6 is an explanatory illustration partially showing the stop changing device.
Figure 9:
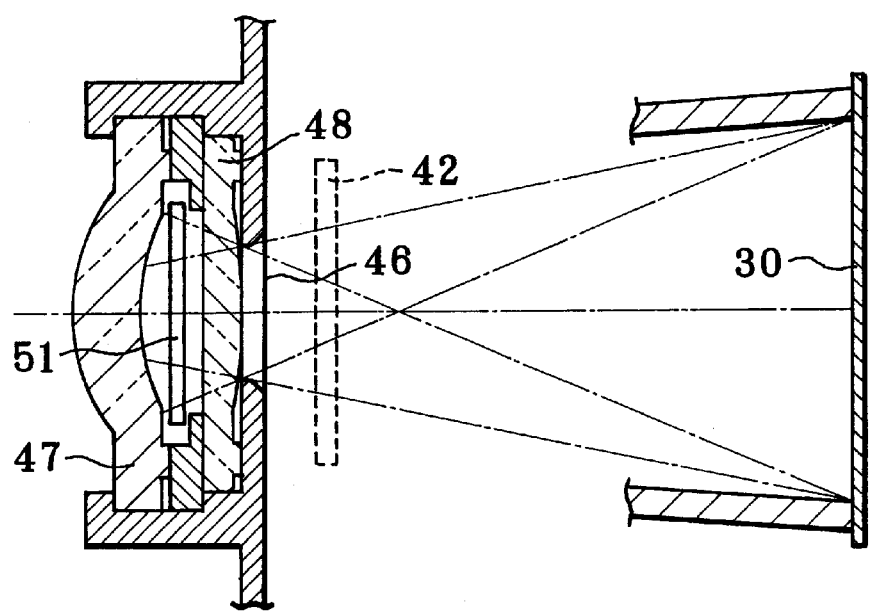
FIG. 9 is a partial section view of the lens-fitted photo film unit.

When the flash switch 16 is set to the ON state and the subject brightness is less than the reference value, namely when a picture is taken under an extremely dark condition such as the night-time, the exposure is performed through the fixed large stop aperture 46 as shown in FIG. 6. The exposure amount increases owing to the fixed large stop aperture 46 such as shown in FIG. 9. Accordingly, proper exposure is performed without causing the underexposure. In the present embodiment, the subject-brightness range of EV6.2 to EV13.2 is covered on account of the transmittance of the taking lens so that a picture may be properly taken at a place being dark to some extent.

In the case of f5.6, namely in the case of the exposure performed through the fixed large stop aperture 46, the focal-point position moves to 1.7 m and good image quality is obtained within an area having the subject distance of 1.0 m to 3.0 m. Beyond this area, the gray zone exists to about 4.0 m so that the photographic area is covered to some extent.

In the above embodiment, the movable stop plate 51 is used so as to be rotatable. However, the movable stop plate may be straightly moved. Moreover, in the above embodiment, the small stop aperture 53 and the middle stop aperture 54 are formed in the movable stop plate 51, and the fixed large stop aperture 46 is formed in the unit body 11. The movable stop plate, however, may be formed with three openings to change the stop in three steps.

Figure 12:
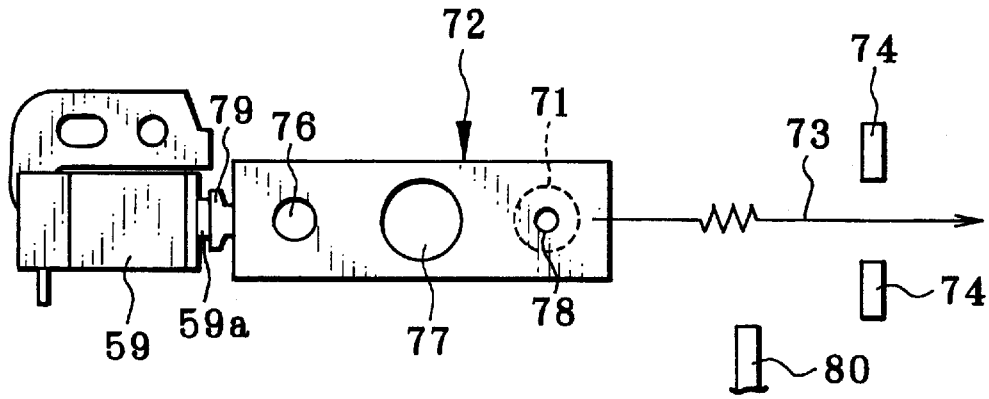
FIG. 12 is an explanatory illustration showing another stop plate of a slide type.

FIG. 12 is an explanatory illustration partially showing a movable stop plate 72 of a slide type. As shown in FIG. 12, an exposure aperture 71 is formed at the photographic optical axis of the unit body 11. A rear side of the exposure aperture 71 is loaded with an unexposed photographic film. In front of the exposure aperture 71, the movable stop plate 72 having a rectangular flat shape is disposed.

At a right side of the movable stop plate 72, a spring 73 and stoppers 74 are disposed. The spring 73 always urges the movable stop plate 72 in a right direction. The stopper 74 retains the movable stop plate 72 against the spring 73. At a left side of the movable stop plate 72, the solenoid 59 is disposed to generate the magnetic force. A left end of the movable stop plate 72 is provided with a metallic piece 79 by which the movable stop plate 72 is drawn toward the solenoid 59 against the spring 73.

The movable stop plate 72 is formed with a middle stop aperture 76, a larger stop aperture 77, and a small stop aperture 78, which are arranged in this order from the left in the drawings. By positioning the respective apertures 76 to 78 at the photographic optical axis, the stop of the photographing system is determined. The middle stop aperture 76 and the small stop aperture 78 are used as the stop of the photographing system by setting them to the photographic optical axis. When the larger stop aperture 77 is set to the photographic optical axis, the exposure aperture 71 provided at the back thereof is used as the stop.

The movable stop plate 72 is moved between a first insert position and a second insert position where the middle stop aperture 76 and the small stop aperture 78 are respectively positioned at the photographic optical axis. Moreover, it is possible to retain the movable stop plate 72 at a third insert position, which is located between the first and second insert positions and where the larger stop aperture 77 is positioned at the photographic optical axis. At this time, a movement range of the movable stop plate 72 is regulated by a regulating projection 80 provided at an under portion thereof. Incidentally, a slid guide, which is not shown, is provided near the movable stop plate 72 to surely slid the stop plate 72 in the right-and-left direction.

The regulating projection 80 provided under the movable stop plate 72 is moved in association with the slide operation of the flash switch 16. Upon turning on the flash switch 16, or upon operating the flash switch 16 upward, the regulating projection 80 is inserted into the movement area of the movable stop plate 72. In contrast, upon turning off the flash switch 16, or upon operating the flash switch 16 downward, the regulating projection 80 is evacuated from the movement area of the movable stop plate 72.

A press lever (not shown) is provided so as to slide the movable stop plate 72 in association with the rotation of the take-up wheel. The press lever slides the movable stop plate 72 against the spring 73 toward the solenoid 59. When one frame is advanced, the movable stop plate 72 abuts on the solenoid 59 and is kept in that position, such as shown in FIG. 12. Incidentally, the press lever makes the movable stop plate 72 slidable in association with the shutter releasing operation.

Next, an operation of the second embodiment is described below. The photographer rotates the take-up wheel 22 to wind up the photographic film 30 by an amount corresponding to one frame. The press lever pushes the movable stop plate 72 toward the solenoid 59 in association with the rotation of the take-up wheel 22. Hence, the metallic piece 79 abuts on the solenoid 59. Upon sliding the flash switch 16 upward, the regulating projection 80 is inserted into the movement area of the movable stop plate 72 in association with the slide operation of the flash switch 16. Upon sliding the flash switch 16 downward, the regulating projection 80 is evacuated from the movement area of the movable stop plate 72 in association with the slide operation of the flash switch 16.

Upon depression of the release button 19, the subject brightness is measured by the photometry circuit 61. When the measured brightness is the predetermined reference value or more, the solenoid 59 is electrified regardless of the setting position of the flash switch 16. The movable stop plate 72 is drawn by the magnetic force of the solenoid 59 so that the movable stop plate 72 is successively kept in this position. Thus, the small stop aperture 78 is positioned at the photographic optical axis.

Figure 13:
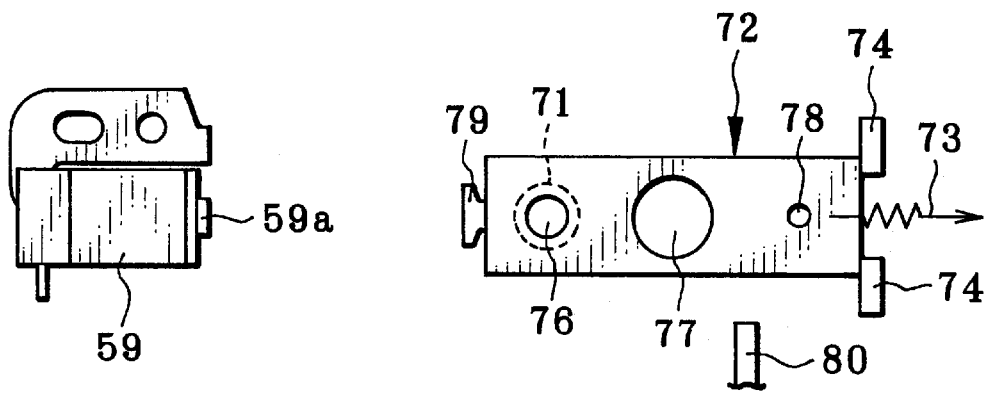
FIG. 13 is an explanatory illustration showing the slide-type stop plate.
Figure 14:
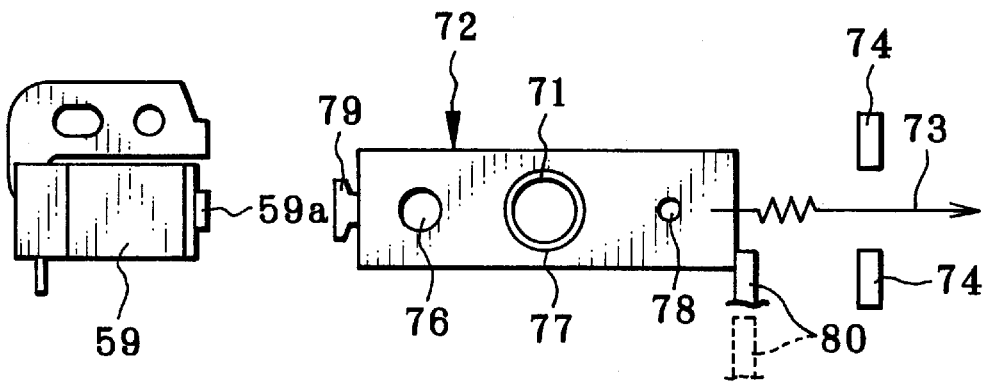
FIG. 14 is an explanatory illustration showing the slide-type stop plate.

When the measured brightness is less than the predetermined reference value, the solenoid 59 is not electrified. The movable stop plate 72 is urged by the spring 73 and is slid in the right direction after evacuating the press lever from the movement area of the movable stop plate 72. In the case that the flash switch 16 is set to the OFF state, the regulating projection 80 is evacuated from the movement area of the stop plate 72 such as shown in FIG. 13. Accordingly, the right end of the movable stop plate 72 is retained by the stoppers 74 so that the middle stop aperture 76 is positioned at the photographic optical axis. By contrast, in the case that the flash switch 16 is set to the ON state, the regulating projection 80 is inserted into the movement area of the stop plate 72 such as shown in FIG. 14. At this time, the right end of the movable stop plate 72 is retained by the regulating projection 80 so that the larger stop aperture 77 is positioned at the photographic optical axis.

After the stop plate 72 has moved, the shutter blade is opened to take a subject image onto the photographic film. Simultaneously, the flash light is emitted from the flash portion 15 under the condition that the flash switch 16 is set to the ON state. Owing to this, photographing is performed with a proper exposure amount and without causing the underexposure and the overexposure.

In the above embodiment, the middle stop aperture 76, the larger stop aperture 77, and the small stop aperture 78 are formed in this order from the left side of the movable stop plate 72. Whereas aperture positions of both sides are easily defined, a central aperture position requires accuracy in comparison with the aperture positions of both sides. In view of this, the larger stop aperture 77 is formed at the central portion, and the middle stop aperture 76 and the small stop aperture 78 are formed at both sides. In doing so, it is possible to reduce mis-operation caused by a placement error of the regulating projection 80. For this reason, it is preferable to form the larger stop aperture 77 in the central portion. Incidentally, in the above embodiment, the stop changing device is built in the lens-fitted photo film unit. However, the stop changing device may be built in a compact camera.

Although the present invention has been fully described by way of the preferred embodiments thereof with reference to the accompanying drawings, various changes and modifications will be apparent to those having skill in this field. Therefore, unless otherwise these changes and modifications depart from the scope of the present invention, they should be construed as included therein.

What is claimed is:

1. A stop changing device for a camera having a photometry unit and a flash unit, said stop changing device changing a stop in accordance with subject brightness measured by said photometry unit, and said camera being provided with a switch member for selecting whether said flash unit is activated or not, said stop changing device comprising:

a fixed stop aperture disposed at a photographic optical axis of said camera;

a stop plate movably provided relative to the optical axis, said stop plate being formed with a first stop aperture, which is smaller than said fixed stop aperture, and a second stop aperture, which is smaller than said first stop aperture; and a stop-plate positioning means for moving said stop plate to select one of said stop apertures, said stop plate being positioned such that said second stop aperture is set to the optical axis regardless of an operation of said switch member when said subject brightness is a predetermined level or more, and said stop plate being positioned so as to select either of said fixed stop aperture and said first stop aperture in accordance with the operation of said switch member when said subject brightness is less than the predetermined level.

2. A stop changing device according to claim 1, wherein said fixed stop aperture is selected when said subject brightness is less than the predetermined level and said flash unit is activated, and said first stop aperture is selected to be set to the optical axis when said subject brightness is less than the predetermined level and said flash unit is not activated.

3. A stop changing device according to claim 2, wherein said stop plate has an L-figure shape and is rotatable, said first and second stop apertures being formed at an end portion of said stop plate.

4. A stop changing device according to claim 3, wherein said stop-plate positioning means comprises:

a spring for urging said stop plate toward the outside of the optical axis;

an electromagnet to be driven when said subject brightness is the predetermined level or more, said electromagnet keeping said stop plate against said spring in a small-stop position where said second stop aperture is set to the optical axis; and a stopper for entering a movement area of said stop plate in association with the operation of said switch member, said stopper projecting into said movement area to abut on said stop plate when said flash unit is not activated so that said stop plate is retained at a middle-stop position where said first stop aperture is set to the optical axis, and said stopper being evacuated from said movement area when activating said flash unit so that said stop plate is allowed to move to the outside of the optical axis and said fixed stop aperture is selected.

5. A stop changing device according to claim 4, further comprising:

a rotatable stop lever to which said stop plate is attached.

6. A stop changing device according to claim 5, wherein said electromagnet keeps said stop plate in said small-stop position by drawing an iron piece fixed to said stop lever.

7. A stop changing device according to claim 6, wherein a plastic piece is fixed to a portion of said stop plate on which said stopper abuts, said plastic piece preventing said stop plate from transforming.

8. A stop changing device according to claim 2, wherein said stop plate has a large opening formed between said first and second stop apertures, said large opening being larger than said fixed stop aperture and being set to the optical axis when selecting said fixed stop aperture.

9. A stop changing device according to claim 8, wherein said stop plate has a square flat shape and is slidable.

10. A stop changing device according to claim 9, wherein said stop-plate positioning means comprises:

a spring for urging said stop plate in a slid direction thereof;

an electromagnet to be driven when said subject brightness is the predetermined level or more, said electromagnet keeping said stop plate against said spring in a small-stop position where said second stop aperture is set to the optical axis;

a movable stopper for entering a movement area of said stop plate in association with the operation of said switch member, said movable stopper projecting into said movement area to abut on said stop plate when said flash unit is activated so that said large opening is set to the optical axis, and said movable stopper being evacuated from said movement area when said flash unit is not activated so that said stop plate is allowed to further move; and a fixed stopper for abutting on said stop plate moved beyond said movable stopper, said stop plate being retained at a middle-stop position where said first stop aperture is set to the optical axis.

11. A stop changing device according to claim 10, wherein said electromagnet keeps said stop plate in said small-stop position by drawing a metallic piece fixed to an end of said stop plate.

12. A stop changing device according to claim 11, wherein a pair of said fixed stoppers are disposed so as to abut on upper and lower sides of said stop plate.

13. A stop changing device according to claim 2, wherein said camera is a lens-fitted photo film unit loaded with an unexposed photographic film in advance.

14. A stop changing device according to claim 13, wherein a lens employed in said lens-fitted photo film unit has a property that a focal point shifts to a long-distance side as a diameter of said stop becomes smaller.

* * * * *